United States Patent [19]

Mitra et al.

[11] Patent Number: 5,727,956
[45] Date of Patent: Mar. 17, 1998

[54] CONNECTOR ASSEMBLY INCLUDING METAL STRIPS AS CONTACT MEMBERS

[75] Inventors: Niranjan Mitra, Eindhoven; Ronald Bekker, Waalre; Bernardus Paagman, Schijndel, all of Netherlands

[73] Assignee: Berg Technology, Inc., Reno, Nev.

[21] Appl. No.: 503,148

[22] Filed: Jul. 17, 1995

[51] Int. Cl.⁶ ................................................ H01R 9/09
[52] U.S. Cl. ................................. 439/74; 439/931
[58] Field of Search ........................ 439/74, 79, 80, 439/83, 660, 931

[56] References Cited

U.S. PATENT DOCUMENTS

| | | | |
|---|---|---|---|
| 4,455,448 | 6/1984 | Bertolina | 174/35 R |
| 4,734,045 | 3/1988 | Hawkins | 439/931 X |
| 4,921,453 | 5/1990 | O'Brien | 439/931 X |
| 5,028,492 | 7/1991 | Guenin | 439/931 X |
| 5,127,838 | 7/1992 | Zaderej et al. | 439/74 |
| 5,198,793 | 3/1993 | Leveque | 338/172 |

FOREIGN PATENT DOCUMENTS

| | | | |
|---|---|---|---|
| 0570 991 A2 | 7/1990 | European Pat. Off. | 33/9 |
| 0 430 267 A1 | 11/1990 | European Pat. Off. | 13/24 |
| 0 506 042 A2 | 3/1992 | European Pat. Off. | 13/66 |

OTHER PUBLICATIONS

IBM Technical Disclosure Bulletin, vol. 14 No. 7, Dec. 1971.

*Primary Examiner*—Khiem Nguyen
*Attorney, Agent, or Firm*—Daniel J. Long; M. Richard Page

[57] ABSTRACT

Connector provided with an insulating housing and a plurality of electrically conductive contact members each of said contact members (2, 3; 26; 42; 47) being made of a metal layer arranged on a predetermined insulating part of said connector. This metal layer may be arranged on plastic contact pins or, alternatively, be made of metal strips arranged on the housing (4; 24; 41) of said connector.

9 Claims, 3 Drawing Sheets

CONNECTOR ASSEMBLY INCLUDING METAL STRIPS AS CONTACT MEMBERS

BACKGROUND OF THE INVENTION

1. Field of the Invention

The present invention relates to a connector comprising an insulating housing and a plurality of electrically conductive contact members.

2. Description of Prior Developments

Until now connectors comprise plastic housings into which metal contact members are inserted designed to cooperate with metal contact members of mating connectors. These contact members may have a male, female or hermaphroditic shape. Such conventional contact members are normally stamped from a larger metal plate and often need bending to provide them with a shape suitable for the intended application. They need be inserted into predetermined cavities of the connector, which cavities are often provided with locking means, such as dimples, which stress the connector housings. During soldering such conventional contact members to a substrate, eg. a printed circuit board or a back plane, generated heat may cause damages because of the relatively large heat capacity of the metal contact members.

It is commonly known in the field of connector technology that printed circuit boards may be provided with one or more metal pads or traces adjacent one or more sides which pads or traces may be contacted by contact terminals of a connector by inserting a (part of a) side of such a printed circuit board into the connector. As far as known to Applicant it is not suggested before to use similar pads or traces on the surface of a connector housing instead of metal contact terminals.

SUMMARY OF THE INVENTION

The object of the present invention is to provide a connector which is entirely free from separate metal contact members.

Therefore, according to the invention, a connector comprising an insulating housing and a plurality of electrically conductive contact members is characterized in that each of said contact members is made of a metal layer arranged on a predetermined insulating part of said connector. By substituting each metal contact member by a metal layer on a predetermined part of the connector no separate metal contact members need be made anymore, thereby avoiding all tolerance requirements and costs related to the separate metal contact members. Moreover, metal layers arranged on predetermined parts of the connector need less space than, separate metal contact members, thus offering interesting possibilities for further miniaturization of connectors.

The present invention is, among others, based on the insight that, in practice, most connectors are nowadays only connected and/or disconnected a few times during their intended life and that wear of the metal layer occurring during connecting and/or disconnecting connectors is of little importance.

In one embodiment some of said contact members are made of a metal layer arranged on plastic contact pins. This embodiment can be conceived as comprising male contact members made of metallized plastic contact pins.

In an alternative embodiment some of said contact members are made of a metal strip arranged on the housing of said connector.

When metallized plastic contact pins are used they may be integrally made with the housing. In order to allow for an easy insertion of a connector having metallized plastic contact pins into a mating connector these metallized plastic contact pins are preferably made of a resilient material.

Each of the contact members may comprise a substantially flat contact face for surface mounting the connector to a substrate.

The present invention is also directed to a connector assembly comprising at least one connector as defined above and a substrate, said connector and substrate being connected together by surface mounting.

Moreover, the present invention is directed to a connector assembly comprising at least one connector defined above and a further mating connector comprising further contact members designed in such a way as to contact corresponding contact members.

Such latter connector assembly may comprise a connector comprising at least one cavity provided at its inside with at least one contact strip, whereas the further mating connector is provided with at least one plastic pin-like member coated with a metal contact strip, wherein the connector and the further mating connector are designed to be inserted into each other in order to establish electrical contact between said at least one contact strip and a corresponding metal contact strip on said at least one pin-like member.

BRIEF DESCRIPTION OF THE DRAWINGS

The present invention will be explained in detail by referring to some accompanying drawings, which illustrate, by way of example, some embodiments of the present invention.

BRIEF DESCRIPTION OF THE PREFERRED EMBODIMENTS

Figure 1:
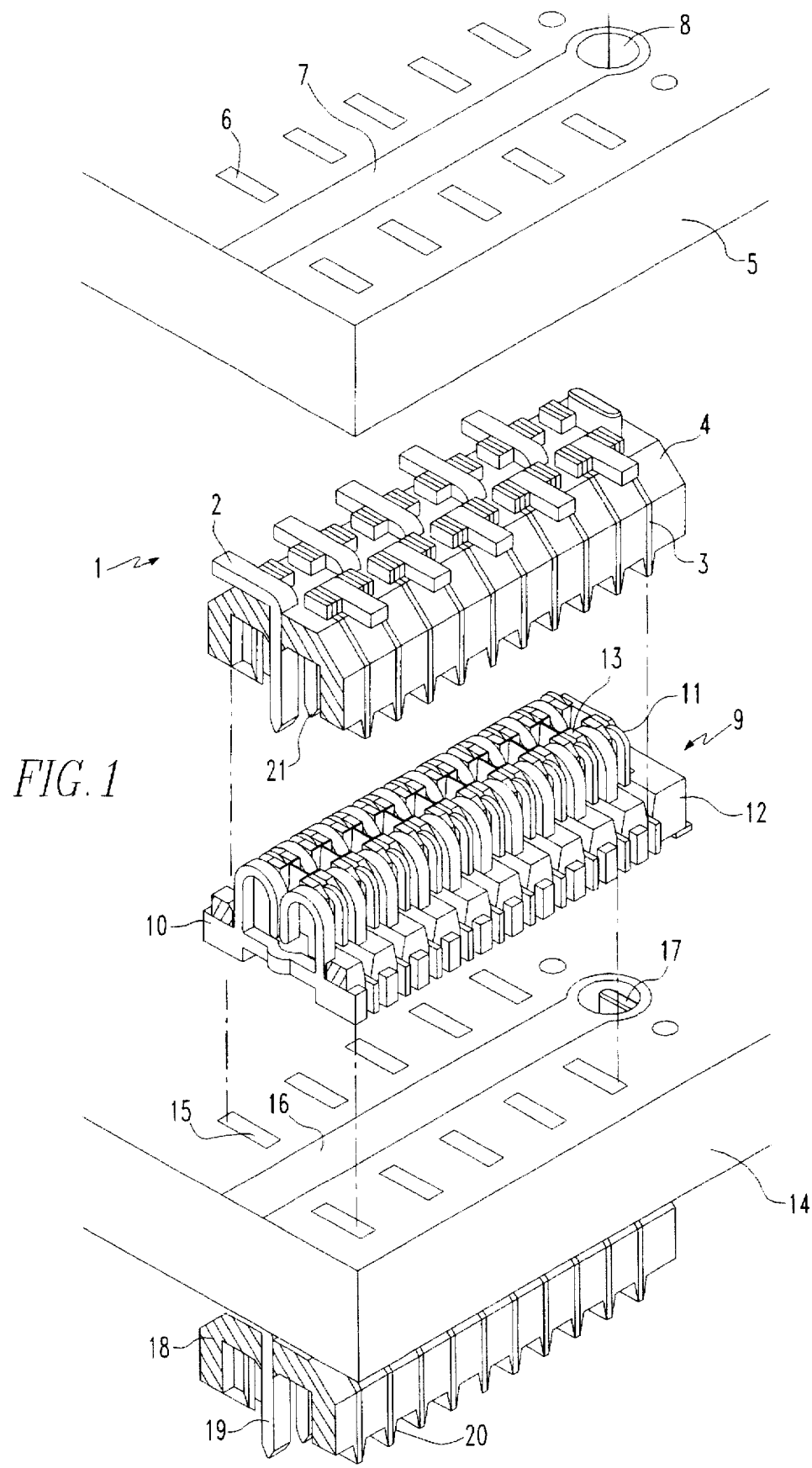
FIG. 1 shows a first embodiment of a connector according to the invention.

Connector 1, shown in FIG. 1, is made in accordance with the principles of the present invention. Connector 1 comprises an insulating housing 4. Contact strips 3, e.g. intended to function as ground layers, are arranged on the outside surface of housing 4. Right-angled contact pins 2 are inserted through the housing 4 to provide signal contact members. Flat bent faces of the contact pins 2 are intended to be soldered to contact pads (not shown) on a substrate 5. Substrate 5 may be a printed circuit board, a back plane, a daughter board or the like. In accordance with the invention the contact pins 2 are made of metallized plastic members.

Connector 1 is designed to cooperate with a further connector 9. Connector 9 comprises an insulating housing 12. Connector 9 is, moreover, provided with signal contacts 10 and ground contacts 11. Insulating housing walls 13 are provided between the signal contacts 10 and the ground contacts 11. Connector 9 can be mounted on a substrate 14 by surface mounting. Each signal contact 10 can be soldered to a corresponding contact pad 15 on the substrate 14 whereas the ground contact members 11 are all solderable to a ground layer 16 on substrate 14.

Substrate 14 may be provided with a connection hole 17 which is able to cooperate with a hold-down peg (not shown) at the bottom side of connector 9.

Substrate 14 may be provided with a back plane connector 18 at its bottom side. The back plane connector 18 is similar to connector 1 and is provided with metallized plastic contact pins 19 and ground contact strips 20 at its surface.

Substrate 5 may be provided with further contact paths 6, at least one ground layer 7 and a connection hole 8 by which a further connector (not shown) may be surface mounted to the top side of substrate 5.

When connector 1 is surface mounted to the bottom side of substrate 5 and connector 9 is surface mounted to the top side substrate 14 electronic circuits (not shown) on substrate 5 and substrate 14 may be interconnected by connecting connectors 1 and 9 together. When connecting connector 1 and connector 9 metallized plastic contact pins 2 are inserted between resilient parts of corresponding signal contact members 10, as shown by dotted lines in FIG. 1.

Contact pins 2 extend in a cavity 21 of connector 1. The contact strips 3 of connector 1 extend from the outside to the inside surface of the cavity 21 in order to allow electrical contact with ground contacts 11 of connector 9. When connector 9 is also made in accordance with the principles of the present invention both signal contacts 10 and ground contacts 11 are made of metallized (resilient) plastic elements, optionally integral with housing 12.

Figure 2:
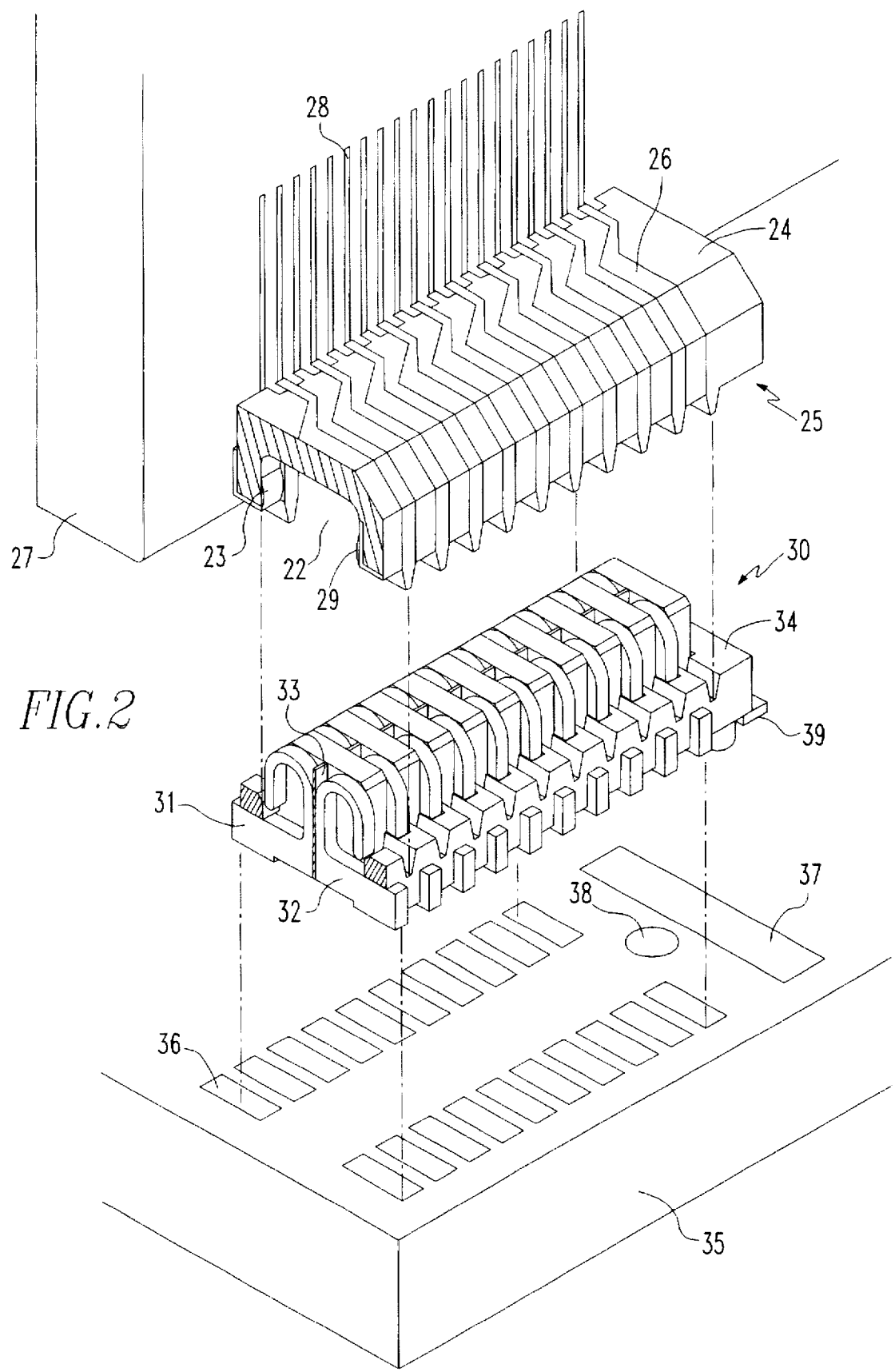
FIGS. 2 and 3 show alternative embodiments of connectors according to the present invention.

FIG. 2 shows a second embodiment of a connector 25 according to the invention. Connector 25 comprises an insulating housing 24. Contact strips 26 extend from the outside surface of the housing 24 into the inside surface of a cavity 22 enclosed by the housing 24. Opposite each contact strip 26 inside the cavity 22 further contact strips 23 are provided on the inside surface of the cavity 22. These further contact strips 23 lead to a side surface of the housing 24. Also the contact strips 26 lead to this latter side surface of the housing 24. Connector 25 may be surface mounted to a substrate 27 by this latter side surface by soldering the contact strips 23, 26 to correspondingly spaced contact strips 28 on the substrate 27.

The housing 24 of connector 25 may, within the cavity 22, be provided with small curvatures 29 arranged below those parts of the contact strips 23, 26 extending within the cavity 22.

Connector 25 is intended to cooperate with an other connector 30, also shown in FIG. 2. Connector 30 comprises a housing 34 of a suitable insulating material. Connector 30 comprises two rows of oppositely arranged signal contact members 31, 32 separated by insulating separating walls 33. The two rows of signal contacts 31, 32 can be inserted into the cavity 22 of connector 25 in order to electrically contact respective contact strips 23, 26 of connector 25. In accordance with the present invention, the signal contact members 31, 32 are preferably made of metallized plastic members. These plastic members preferably have a spring action in order to provide for easy insertion of connector 30 into the cavity 22 of connector 25.

Connector 30 may be surface mounted to a substrate 35 by soldering signal contacts 31, 32 to corresponding contact pads 36 on substrate 35. Substrate 35 may also be provided with a ground layer 37 to be connected to a ground contact layer 39 on the connector housing 34.

Moreover, substrate 35 may be provided with a connection hole 38 to receive a hold-down peg (not shown) provided at the bottom side of connector 30. It is observed that the signal contact density of connector 30 is doubled compared to the signal contact density of connector 9 in FIG. 1 since the signal contact member of connector 30 is split into two parts 31, 32.

Figure 3:
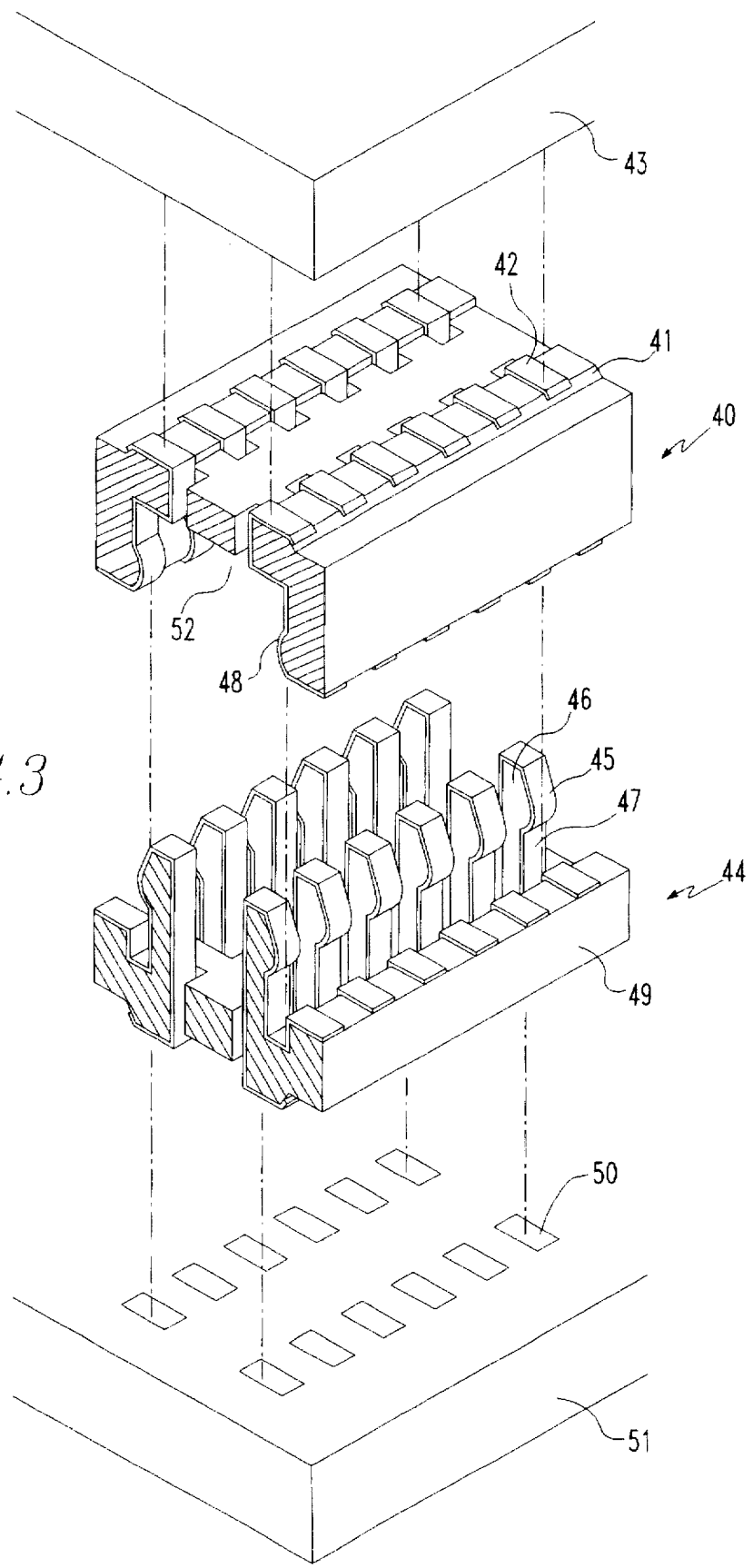

FIG. 3 shows a further embodiment of a connector according to the invention. Connector 40 comprises an insulating housing 41 which is provided with metal contact strips 42. The contact strips 42 extend mainly on the inside surface of a cavity 52 enclosed by the housing 41. Besides, the contact strips 42 have little flat parts at the top side and at the bottom side of connector 40. These flat parts at the top side of connector 40 allow surface mounting of connector 40 to a substrate 43.

Connector 40 is designed to cooperate with an other connector 44 which is designed in accordance with the principles of the present invention. Connector 44 comprises pin-like members 46 which are at least partly metallized with a contact strip 47. In order to allow easy insertion of connector 44 into cavity 52 of connector 40 the pin-like members 46 need to have a spring action.

Locking of connector 44 into connector 40 is supported by the provision of a curvature 45 at the end of each pin-like member 46 and a curvature 48 at the outside edge of cavity 52.

Preferably, the pin-like members 46 are integrally made with housing 49 of connector 44.

The contact strips 47 preferably extend to the bottom side of connector 44 to provide flat faces by means of which connector 44 may be surface mounted to contact pads 50 on a substrate 51.

The connectors according to the present invention can be made by any suitable method. However, one suitable method is described in Applicant's copending European patent application (our reference number BO 39328) from which the following manufacturing steps to produce a connector according to the present invention may be deduced:

a. depositing a first, electroless metal layer of a first predetermined thickness on the surface of the connector;

b. ablating predetermined parts of said first metal layer in order to produce first metal layer sub-areas which are electrically separated from the remaining area of said first metal layer;

c. depositing a second, galvanic metal layer of a second predetermined thickness to said first metal layer sub-areas only;

d. removing the remaining area of said first metal layer area.

The first metal layer subareas referred to in this method correspond to all those locations on the connector onto which metal layers have to be arranged. When the method according to said Applicant's copending European patent application is used a high energy beam may be used, for example an electron beam or ion beam, to separate the first metal layer subareas from the remaining first metal layer area. A light beam or a laser beam may be used instead, whereas also grinding may be used. Removing any non-selected metal layer area in step d. referred to above may be done by chemical etching or by grinding processes. The first metal layer may be made of electroless copper or nickel and may have a thickness of 1 to 2 µm. The second thickness referred to above may be 5 to 10 µm. The galvanic metal layer may be coated with a top coat finish layer, for instance, made of nickel, gold, or tin-lead, which finish layer may have a thickness between 2 to 4 µm. For further details as to said method for manufacturing selectively metallized plastic members reference is made to said copending European patent application.

It is to be understood that the scope of the present invention is only limited by the scope of the annexed claims. The embodiments in the figures are only given by way of example. Instead of connectors made out of one housing, for instance, connectors made of several parts which have to be fixed together may be used instead. Moreover, the application of the present invention is not restricted to connectors having only two rows of a plurality of contact members. The principles of the present invention, as explained above, are equally applicable to connectors having more than two rows of a plurality of contact members.

We claim:

1. A connector assembly comprising a connector (40) comprising an insulating housing and a plurality of electrically conductive contact members characterized in that each of said contact members (2, 3; 26; 42; 47) is made of a metal layer arranged on a predetermined insulating part of said connector, and said connector (40) further comprises at least one cavity (52) provided at its inside with at least one contact strip (42) and said connector assembly further comprises a further mating connector (44) being provided with at least one plastic pin-like member (46) coated with a metal contact strip (47), wherein the connector (40) and the further mating connector (44) are designed to be inserted into each other in order to establish electrical contact between said at least one contact strip (42) and a corresponding metal contact strip (47) on said at least one pin-like member (46).

2. The connector assembly according to claim 1 characterized in that some of said contact members (2; 47) are made of a metal layer arranged on plastic contact pins.

3. The connector assembly according to claim 1 or 2 characterized in that some of said contact members (3; 26; 42) are made of a metal strip arranged on the housing (4; 24; 41) of said connector.

4. The connector assembly according to claim 2 characterized in that said plastic contact pin (46) is integrally made with the housing (49).

5. The connector assembly according to claim 2 or 4 characterized in that said plastic contact pin is made of a resilient material.

6. The connector assembly according to claim 1 characterized in that each of said contact members comprises a substantially flat contact face for surface mounting the connector to a substrate.

7. The connector assembly according to claim 6 wherein said connector and substrate are connected together by surface mounting.

8. The connector assembly according to claim 1 characterized in that each of said plastic pin-like members (46) is integrally made with the housing (49) of said further connector (44).

9. The connector according to claim 1 characterized in that each of said plastic pin-like members (46) is made of a resilient material.

* * * * *